(12) United States Patent
Lord et al.

(10) Patent No.: US 11,852,239 B2
(45) Date of Patent: Dec. 26, 2023

(54) SEAL FOR AN ANGLED CONNECTOR

(71) Applicant: Tyco Electronics France SAS, Pontoise (FR)

(72) Inventors: Steven Lord, Pontoise (FR); Xavier Rouillard, Pontoise (FR)

(73) Assignee: Tyco Electronics France SAS, Pontoise (FR)

( * ) Notice: Subject to any disclaimer, the term of this patent is extended or adjusted under 35 U.S.C. 154(b) by 49 days.

(21) Appl. No.: 17/308,286

(22) Filed: May 5, 2021

(65) Prior Publication Data

US 2021/0348685 A1  Nov. 11, 2021

(30) Foreign Application Priority Data

May 6, 2020  (EP) .................................... 20305448

(51) Int. Cl.
  *F16J 15/06* (2006.01)
  *F16J 15/02* (2006.01)
  *H05K 5/06* (2006.01)

(52) U.S. Cl.
  CPC ........... *F16J 15/062* (2013.01); *F16J 15/025* (2013.01); *H05K 5/061* (2013.01)

(58) Field of Classification Search
  CPC .. F16J 15/00; F16J 15/06; F16J 15/061; F16J 15/062; F16J 15/064; F16J 15/065; F16J 15/02; F16J 15/025; H05K 5/00; H05K 5/06; H05K 5/061; H05K 5/0095

USPC ......................................................... 277/637
See application file for complete search history.

(56) References Cited

U.S. PATENT DOCUMENTS

| | | | | |
|---|---|---|---|---|
| 2005/0112912 A1* | 5/2005 | Ripper | ............... | H01R 13/5205 439/67 |
| 2007/0224881 A1* | 9/2007 | Fujiwara | ............ | H01R 13/5221 439/587 |
| 2012/0034800 A1* | 2/2012 | Shiga | ..................... | H01R 43/20 439/271 |

FOREIGN PATENT DOCUMENTS

| | | |
|---|---|---|
| CN | 104505604 A | 4/2015 |
| CN | 110212366 A | 9/2019 |
| DE | 19816216 A1 | 10/1999 |

OTHER PUBLICATIONS

Extended European Search Report, dated Oct. 19, 2020, 7 pages.
Abstract of DE 19816216, dated Oct. 21, 1999, 1 page.

* cited by examiner

*Primary Examiner* — Nathan Cumar
(74) *Attorney, Agent, or Firm* — Barley Snyder

(57) ABSTRACT

A seal for an angled connector includes a rim wall enclosing a central opening and a sealing passage extending from outside the seal through the rim wall into the central opening. The seal has a planar plate-shaped configuration.

22 Claims, 2 Drawing Sheets

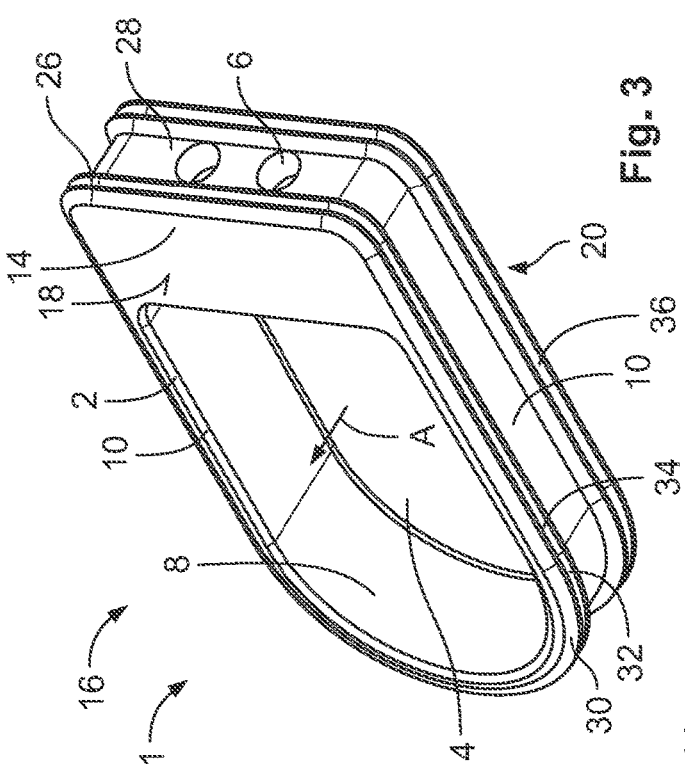
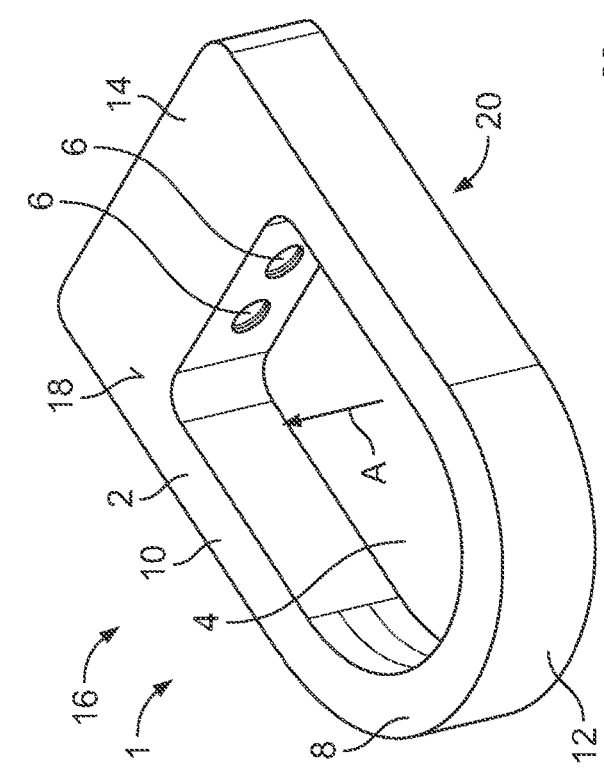
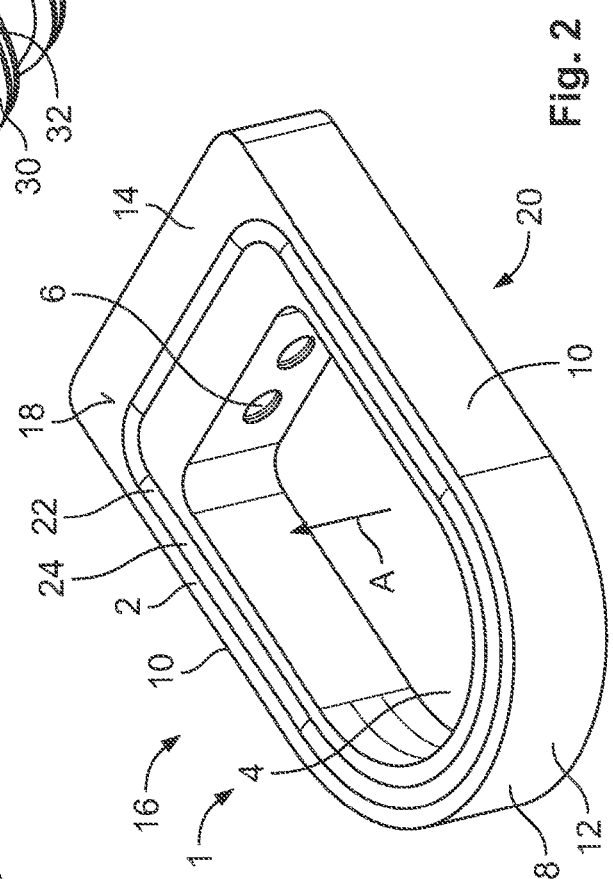
Fig. 1
Fig. 2
Fig. 3

SEAL FOR AN ANGLED CONNECTOR

CROSS-REFERENCE TO RELATED APPLICATIONS

This application claims the benefit of the filing date under 35 U.S.C. § 119(a)-(d) of European Patent Application No. 20305448.1, filed on May 6, 2020.

FIELD OF THE INVENTION

The present invention relates to an angled connector and, more particularly, to a seal for an angled connector.

BACKGROUND

Angled connectors are used for a variety of applications, for example as squib connectors in airbags. In angled connectors, a wire is inserted into a cavity of a connector housing in a first direction and a tip portion of the wire comprising a terminal is oriented in the cavity in a second direction angled to the first direction. Usually the connector housing comprises a base cover and a top cover mounted to each other enclosing the cavity. In order to protect the angled connector from contaminants such as liquids, which may cause a short of the angled connector, it is essential to seal the connector. Both the interface between the top and bottom cover and the wire insertion into the cavity of the connector housing needs to be sealed.

SUMMARY

A seal for an angled connector includes a rim wall enclosing a central opening and a sealing passage extending from outside the seal through the rim wall into the central opening. The seal has a planar plate-shaped configuration.

BRIEF DESCRIPTION OF THE DRAWINGS

The invention will now be described by way of example with reference to the accompanying Figures, of which:

FIG. 1 is a perspective view of a seal according to a first embodiment;

FIG. 2 is a perspective view of a seal according to a second embodiment;

FIG. 3 is a perspective view of a seal according to a third embodiment;

DETAILED DESCRIPTION OF THE EMBODIMENT(S)

Figure 5:
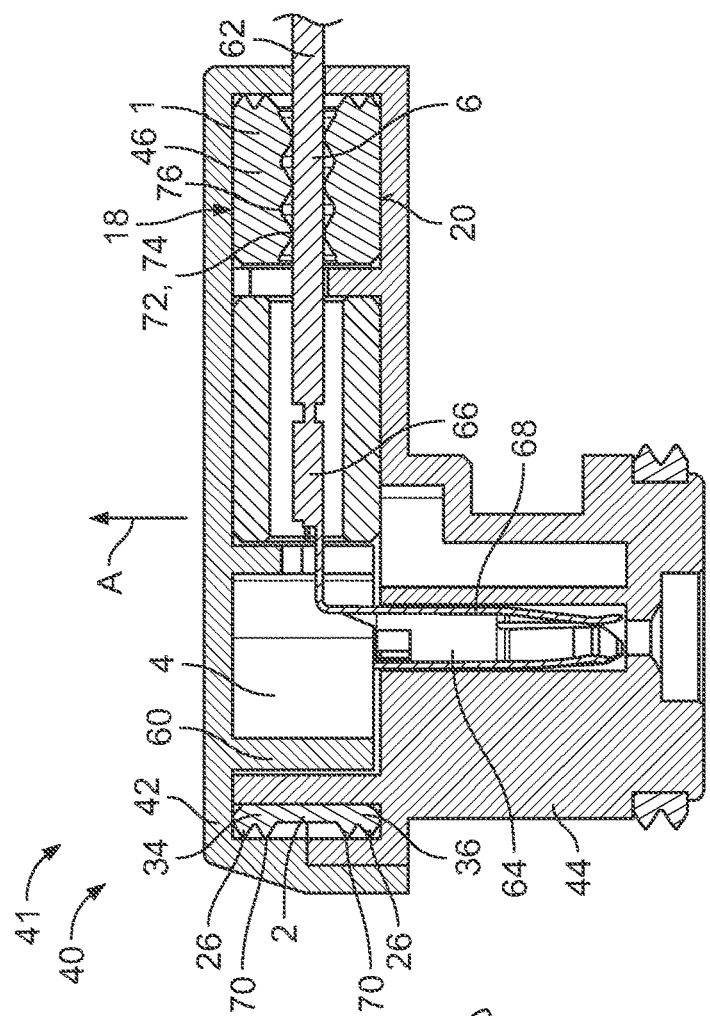
FIG. 5 is a sectional side view of an angled connector with the seal of FIG. 3.

In the following, the seal according to the invention is explained in greater detail with reference to the accompanying drawings, in which exemplary embodiments are shown. According to the description of the various aspects and embodiments, elements shown in the drawings can be omitted if the technical effects of these elements are not needed for a particular application, and vice versa: i.e. elements that are not shown or described with reference to the figures but are described herein can be added if the technical effect of those particular elements is advantageous in a specific application. In the figures, the same reference numerals are used for elements which correspond to one another in terms of their function and/or structure.

First, exemplary embodiments of an inventive seal 1 are described with reference to FIGS. 1 to 3. The seal 1 according to the invention may be adapted for an angled connector, wherein the seal 1 has an essentially planar plate-shaped configuration. The seal 1 has a rim wall 2 that encloses a central opening 4, whereby at least one sealing passage 6 extends from outside the seal 1 through the rim wall 2 into the central opening 4.

A wire may be sealingly received in the sealing passage 6 and be introduced into the central opening 4, at which a tip portion of the wire may be bent, so that the tip portion may be arranged at an angle, particularly at a 90° angle, to the remainder of the wire, particularly the section of the wire received in the sealing passage 6.

The seal 1 may be a single wire seal having only one sealing passage 6 for a single wire. However, in an embodiment, the seal 1 may be a family seal having multiple sealing passages 6, each adapted to sealingly receive a single wire. In the embodiments shown in FIGS. 1 to 3, two sealing passages 6 are provided. Of course it is also possible to provide more than two sealing passages 6 according to the application requirements. As shown in FIGS. 1 to 3, when at least two sealing passages 6 are provided, the at least two sealing passages 6 may extend parallel to one another radially through the base 14. In an exemplary embodiment, the seal 1 may comprise at least two sealing passages 6 each for sealing a different wire.

In the embodiment shown in FIGS. 1 to 3, the central opening 4 may penetrate the seal 1 in an axial direction A, allowing access to the wire inserted into the central opening 4 via the sealing passage 6 to be accessible from either side in the axial direction A.

The seal 1, particularly the rim wall 2, may comprise an essentially U-shaped arc section 8 shown in FIGS. 1 to 3, having two arms 10 extending parallel to one another and a bow 12 connecting the two arms 10 remote from the sealing passage 6. The ends of the arms 10 distal from the bow 12 may be connected to one another with an essentially straight base 14. The base 14 may comprise a larger material thickness in a radial direction than the arc section 8. The sealing passage 6 may extend essentially parallel to a radial direction through the base 14, the radial direction being arranged essentially perpendicular to the axial direction A. Thus, the sealing interface between the sealing passage 6 and the wire may be increased. Furthermore, in an embodiment, the base 14 may be rather rigid compared to the U-shaped arc section 8, therefore preventing any damage to the wire in the sealing passage 6 due to unintentional deformation of the base 14.

In order to facilitate the handling of the seal 1 and further reduce the manufacturing costs of the seal 1 particularly in large numbers, the seal 1 may be a monolithic component 16, which may be formed for example by injection molding. The seal 1, in an embodiment, is a silicone material.

The sealing passages 6 may extend continuously from outside the seal 1 through the rim wall 2 into the central opening 4, so that no transition area between the central opening 4 and the rim wall 2 is provided, which may negatively affect the sealing performance of the seal 1. The central opening 1 may particularly be a single, continuous opening which is not separated into different subsections.

To further improve the sealing reliability of the seal 1, the entire rim wall 2 may be arranged in a plane. The entire rim wall 2 may comprise an essentially planar top surface 18 and an essentially planar bottom surface 20, as shown in FIGS.

1 to 3. In an embodiment, the entire rim wall 2 may be planar. The rim wall 2 may be arranged essentially parallel to the central opening 4. The entire top and/or bottom surface 18, 20 may extend in a single plane, respectively. If both the top and the bottom surface 18, 20 each extend in a single plane, the single planes may be spaced apart from one another in an axial direction A.

In an embodiment, the seal 1 may be symmetrical along a plane essentially perpendicular to the axial direction A, such that the seal 1 may be inserted into the cavity in at least two different orientations without negatively affecting the sealing performance. Thus, the seal 1 can be further fool proofed. It is noted that the terms "top" and "bottom" are solely used for distinguishing the opposing surfaces of the seal 1 and not to imply a particular necessary direction, whereby one surface is directed parallel to the axial direction to a first cover part and the other surface is directed towards a further cover part, i.e. the top and bottom cover, respectively.

In an embodiment, the entire rim wall 2 may have a constant thickness in the axial direction A, so that the top cover and the bottom cover of the connector may evenly axially compress the seal 1. The axial thickness of the rim wall 2 at the arc section 8 may be larger than the diameter of the sealing passage 6 so that the axial thickness of the base 14 does not have to be increased relative to the arc section 8. Consequently, no transition areas are formed, e.g. due to steps formed on the top and bottom surfaces from the arc section 8 to the base 14.

As shown in FIGS. 1 to 3, the outer shape of the seal 1, particularly the rim wall 2, and the shape of the central opening 4 in a plane essentially perpendicular to the axial direction A may be essentially the same. In an embodiment, the arc section 8, whose curvature may define the shape of both the outer shape of the seal 1 and the shape of the central opening 4 may comprise an essentially constant material thickness, at least in the radial direction. Thus, it may be ensured that the sealing proficiency along the arc section 8 is essentially uniform.

According to the exemplary embodiment shown in FIG. 2, at least one of the bottom surface 20 and the top surface 18, and in an embodiment both, may comprise at least one compression rib 22 protruding axially from the respective surface.

The at least one compression rib 22 may be adapted to press in the axial direction A against the top cover or bottom cover, respectively, whereby due to the axial compression of the at least one compression rib 22 the sealing performance of the seal 1 may be further increased. In order to have an essentially uniform compression, the at least one compression rib 22 may extend on the top 18 and/or bottom surface 20 circumferentially along the entire rim wall 2. In other words, the at least one compression rib 22 may extend along the base 14 and the arc section 8 forming a collar 24 protruding axially from the respective surface 18, 20.

The at least one compression rib 22 may extend continuously along a closed perimeter, meaning that the at least one compression rib 22 does not comprise any interruptions. Of course, it is also possible to provide multiple separate compression ribs 22 separated from one another, e.g. in a radial direction or in a circumferential direction on the respective surface. Alternatively or additionally, the at least one compression rib 22 may be provided on a face side of the top cover and/or bottom cover facing the top surface 18 and bottom surface 20 of the rim wall 2, respectively. In this case, the at least one compression rib 22 presses into the corresponding surface of the seal 1. The top surface 18 and/or bottom surface 20 may be essentially flat having no axial protrusions, as is shown in the first embodiment of the seal 1 depicted in FIG. 1.

In an embodiment, the at least one compression rib 22 may be arranged equidistantly in the radial direction on the top and/or bottom surface 18, 20. In other words, the material thickness of the rim wall 2 from the at least one compression rib 22 radially inwardly and outwardly may be essentially the same. The at least one sealing passage 6 may comprise a diameter less than a material thickness of the rim wall 2.

Usually the top cover and the bottom cover of the angled connector are mounted to one another in the axial direction A. In this case, the axial compression of the seal 1 between the top cover and the bottom cover may lead to a permanent constraint on the covers as the compression of the seal 1 may produce a counter force acting upon the covers pushing them in the axial direction A away from one another.

In order to reduce the axial compression A without negatively affecting the sealing performance, a radial compression of the seal 1 may be envisaged. This may, for example, be enforced by at least one radially outwardly protruding sealing lip 26, as is shown in the exemplary embodiment displayed in FIG. 3. The at least one sealing lip 26 may protrude radially outwardly from a side surface 28 of the rim wall 2 facing radially outwards, i.e. away from the central opening 4. In an embodiment, the at least one sealing lip 26 may extend, particularly continuously, along the circumference of the seal 1, ensuring a uniform radial compression of the seal 1 along it's whole circumference. In order for the at least one sealing passage 6 not to interfere with the at least one sealing lip 26, the at least one sealing lip 26 and the at least one sealing passage 6 may be offset from one another essentially parallel to the axial direction A.

As shown in FIG. 3, a pair of sealing lips 26 may be arranged adjoining one another in the axial direction A, each lip 26 having a radially outwardly protruding protrusion 30 and a notch 32 formed between the pair of protrusions 30. Therefore, a higher load of contact between the seal 1 and the connector housing in the radial direction can be achieved.

In an embodiment shown in FIG. 3, at least one sealing lip 26 may be provided at a top edge 34 of the side surface 28 bordering the top surface 18, and at least one sealing lip 26 may be provided at a bottom edge 36 bordering the bottom surface 20 of the rim wall 2. The at least one sealing lip 26 at the top edge 34 may be adapted to sealingly engage the top cover of the connector housing. Correspondingly, the sealing lip 26 at the bottom edge 36 may be adapted to sealingly engage the bottom cover of the connector housing. The top edge 34 and the bottom edge 36 may be separated from one another essentially parallel to the axial direction A by a middle section 38, through which the at least one sealing passage 6 may extend essentially parallel to the radial direction. As can be seen in FIG. 3, a pair of sealing lips 26 may be provided at the top and at the bottom edge of the side surface 28.

Figure 4:
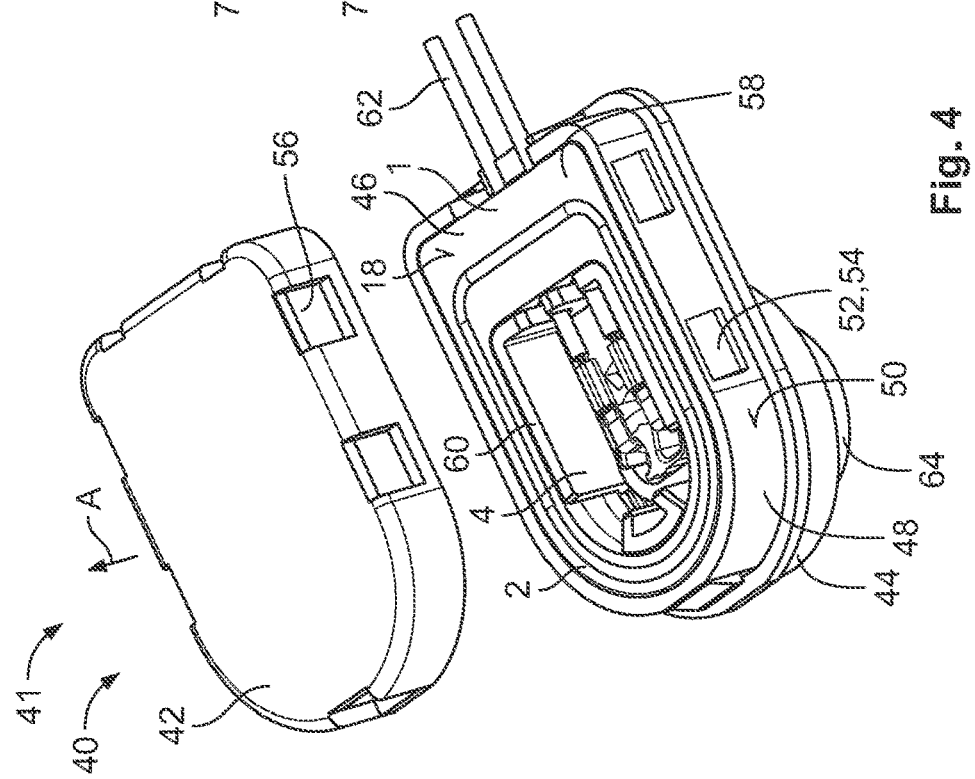
FIG. 4 is an exploded perspective view of an angled connector with the seal of FIG. 2.

Now exemplary embodiments of angled connectors 40 are further elucidated with reference to FIGS. 4 and 5. The angled connector 40 may be a squib connector adapted for use in safety systems in vehicles, particularly in airbag or seatbelt pre-tensioning systems. In an airbag system, the squib connector may be adapted to connect a main wiring of the airbag to an inflator.

The angled connector 40, as shown in FIGS. 4 and 5, may comprise a connector housing 41 having a top cover 42 and a bottom cover 44 being mountable to one another, whereby the top cover 42 and the bottom cover 44 may enclose a cavity 46 when the covers 42, 44 are mounted to each other. The seal 1 may be inserted into the cavity 46, whereby the seal 1 is adapted to sealingly engage the top cover 42 and the bottom cover 44. In FIG. 4 a schematic perspective view of a first exemplary embodiment is shown, whereby the top cover 42 is removed from the bottom cover 44 allowing visual access to the cavity 46 and the seal 1 mounted in the cavity 46.

In the embodiment shown in FIGS. 4 and 5, the seal 1 according to FIG. 2 is inserted into the cavity 46, such that the bottom surface 20 of the rim wall 2 lies on a face side of the bottom cover 44 and the top surface 18 is adapted to abut a face side of the top cover 42, the face sides facing towards the cavity 46.

The bottom cover 44 may comprise an axially protruding frame 48, as shown in FIG. 4, whose radially outwards facing surface 50 may comprise fastening devices 52, such as latches 54, which may engage complementarily formed fastening devices 56 of the top cover 42 in a form-locking manner. The frame 48 may frame a compartment 58 in the bottom cover 44 in which the seal 1 may be fittingly received, whereby the frame 48 comprises an opening being aligned with a corresponding sealing passage 6 of the seal 1, in order to allow the wire to enter the cavity 46 from outside the connector 40.

As shown in FIGS. 4 and 5, the bottom cover 44 may comprise a support structure 60 fittingly inserted into the central opening 4 so as to provide a fortification for the rim wall 2, particularly the arc section 8. The support structure 60 may prevent any deformation of the rim walls 2 inside the cavity 46 and thus secure the seal 1 within the cavity 46. When the top cover 42 is mounted to the bottom cover 44 essentially parallel to the axial direction A, an axial compression force acts on the seal 1 compressing the seal 1 parallel to the axial direction A between the top cover 42 and the bottom cover 44. With the seal 1 having an essentially planar plate-shaped configuration, the seal 1 may be uniformly compressed within the cavity 46 without having any transition areas caused by steps or the like in the seal 1, which may negatively affect the sealing performance of the seal 1.

A wire 62 may be inserted into the housing and through the sealing passage 6, as shown in FIGS. 4 and 5. Thus, the wire 62 may be sealingly inserted into the connector housing 41 comprising the top cover 42 and bottom cover 44 mounted to one another. The wire 62 may extend from the sealing passage 6 through the support structure 60 into an extension 64 of the bottom cover 44, which extends in a direction arranged in an angle to a radial plane. In this case, the angled connector 40 may be a 90° angled connector, so that the extension 64 may extend essentially parallel to the axial direction A away from the top cover 42. A tip portion 66 of the wire 62 may be terminated onto a terminal 68, which may extend essentially parallel to the extension 64 into the extension 64, e.g. coaxially to the extension 64.

In FIG. 5, a second exemplary embodiment of the angled connector 40 is shown in a schematic cut view cut along a plane essentially parallel to the axial direction A. In the second embodiment, a seal 1 according to FIG. 3 is inserted into the cavity 46 such that the sealing lips 26 at the top edge 34 are radially pressed against a side wall 70 of the top cover 42 and the sealing lips 26 at the bottom edge 32 are radially pressed against a side wall 70 of the bottom cover 44. Therefore, the seal 1 may radially, hermetically seal the top cover 42 and bottom cover 44.

The seal 1 and the connector housing 41 comprising the top cover 42 and the bottom cover 44 may be separate parts being removable from one another, so that the seal 1 may easily be replaced in the case of any malfunctions.

FIG. 5 shows at least one sealing passage 6. The sealing passage 6 may be adapted to sealingly receive the wire 62, such that fluid, particularly liquid is not able to enter the angled connector 40 via a wire entrance.

In order to increase the amount of contact points and further stabilize the wire 62 in the sealing passage 6, an inner wall 72 of the sealing passage 6 may comprise an essentially undulating shape, such as a so-called "sine"-waveform, having peaks 74 protruding into the sealing passage 6 and indentations 76 between two adjacent peaks 74 in the radial direction. The indentations 76 provide space for the material of the peaks 74 to disperse into, when being compressed. Therefore, a play may be provided allowing wires 62 within a predetermined range of wire diameters to be sealingly received in the sealing passage 6.

The at least one sealing passage 6 may be adapted to receive the terminal 68 so that the wire 62 may be terminated, by crimping or welding, prior to insertion into the sealing passage 6. The terminal 68 end portion usually comprises a larger diameter than the remainder of the wire 62. Therefore, the inner wall 72 of the sealing passage 6 may be adapted to be elastically deflected, so that the terminal 68 may pass through the sealing passage 6.

What is claimed is:

1. A seal for an angled connector, comprising:
a rim wall enclosing a central opening, the central opening extends fully through the seal in an axial direction; and
a sealing passage extending from outside the seal through the rim wall into the central opening, the seal having a planar plate-shaped configuration, the seal is monolithically formed in a single piece from an elastically compressible material.

2. The seal of claim 1, wherein the sealing passage extends continuously from outside the seal into the central opening.

3. The seal of claim 1, wherein the rim wall is entirely planar.

4. The seal of claim 1, wherein the rim wall has at least one of a planar top surface and a planar bottom surface extending in a plane essentially parallel to a radial direction of the central opening.

5. The seal of claim 4, wherein a compression rib protrudes from at least one of the planar top surface and the planar bottom surface.

6. The seal of claim 5, wherein the compression rib extends continuously along a closed perimeter.

7. The seal of claim 1, further comprising a radially outwardly protruding sealing lip.

8. The seal of claim 7, wherein the radially outwardly protruding seal lip extends circumferentially around the seal.

9. The seal of claim 7, wherein the radially outwardly protruding sealing lip is one of a pair of radially outwardly protruding sealing lips.

10. The seal of claim 9, wherein the pair of radially outwardly protruding sealing lips are arranged on a pair of axially opposite ends of a radially outwardly facing side surface of the rim wall.

11. The seal of claim 1, further comprising an essentially U-shaped arc section having a pair of arms extending parallel to one another.

12. The seal of claim 11, further comprising a bow connecting the pair of arms, a pair of ends of the arms remote from the bow are connected to one another by a straight base.

13. The seal of claim 12, wherein the sealing passage radially extends from outside the seal through the straight base into the central opening.

14. The seal of claim 12, wherein the straight base has a larger radial thickness than the essentially U-shaped arc section.

15. The seal of claim 1, wherein the sealing passage is one of a pair of sealing passages arranged parallel to one another.

16. The seal of claim 1, wherein the rim wall is formed of a silicone material.

17. An angled connector, comprising:
 a top cover;
 a bottom cover mounted to the top cover and closing a cavity; and
 a seal held in the cavity sealingly engaging the top cover and the bottom cover, the seal is positioned between the top cover and the bottom cover in an axial direction, the seal having a planar plate-shaped configuration and including a rim wall enclosing a central opening and a sealing passage extending from outside the seal through the rim wall into the central opening, the seal is monolithically formed in a single piece from an elastically compressible silicone material.

18. A seal for an angled connector, comprising:
 a rim wall enclosing a central opening; and
 a sealing passage extending from outside the seal through the rim wall into the central opening, the seal having a planar plate-shaped configuration, the sealing passage has an inner wall with an undulating shape.

19. The seal of claim 18, wherein the undulating shape has a plurality of peaks protruding into the sealing passage and a plurality of indentations arranged between adjacent peaks.

20. A seal for an angled connector, comprising:
 a rim wall enclosing a central opening, the central opening extends through the seal in an axial direction, the rim wall has at least one of a planar top surface and a planar bottom surface extending in a plane essentially parallel to a radial direction of the central opening, a compression rib protrudes from at least one of the planar top surface and the planar bottom surface; and
 a sealing passage extending from outside the seal through the rim wall into the central opening, the seal having a planar plate-shaped configuration.

21. The seal of claim 20, wherein the compression rib extends continuously along a closed perimeter.

22. A seal for an angled connector, comprising:
 a rim wall enclosing a central opening, the central opening extends through the seal in an axial direction;
 a sealing passage extending from outside the seal through the rim wall into the central opening, the seal having a planar plate-shaped configuration; and
 a radially outwardly protruding sealing lip extending circumferentially around the seal.

* * * * *